(12) United States Patent
Bogi et al.

(10) Patent No.: US 11,206,023 B1
(45) Date of Patent: Dec. 21, 2021

(54) LEVEL SHIFTER WITH BOOST CIRCUIT

(71) Applicant: Arm Limited, Cambridge (GB)

(72) Inventors: Seshagiri Rao Bogi, Bangalore (IN);
Gayathri Gandhi, Bangalore (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/900,847

(22) Filed: Jun. 12, 2020

(51) Int. Cl.
*H03K 19/0185* (2006.01)
*H03K 3/356* (2006.01)
*H03K 19/0175* (2006.01)

(52) U.S. Cl.
CPC ............ *H03K 19/018528* (2013.01); *H03K 3/356113* (2013.01); *H03K 19/017509* (2013.01); *H03K 19/018507* (2013.01)

(58) Field of Classification Search
CPC ....... H03K 19/0175; H03K 19/017509; H03K 19/0185; H03K 19/018507; H03K 19/018514; H03K 19/018521; H03K 19/018528
See application file for complete search history.

(56) References Cited

U.S. PATENT DOCUMENTS

| 7,795,946 | B2* | 9/2010 | Kim | ................ | H03K 3/356113 327/333 |
| 2009/0302924 | A1* | 12/2009 | Kim | ................ | H03K 3/356113 327/333 |

* cited by examiner

*Primary Examiner* — Long Nguyen
(74) *Attorney, Agent, or Firm* — Pramudji Law Group PLLC; Ari Pramudji

(57) ABSTRACT

Various implementations described herein are related to a device having a level shifting circuit that shifts an input voltage in a first domain to an output voltage in a second domain, and also, the level shifting circuit may shift the input voltage to the output voltage based on a first level shifting response. The device may also include a boost circuit that increases the input voltage and provides a boosted input voltage to the level shifting circuit so that the level shifting circuit shifts the input voltage to the output voltage based on the boosted input voltage.

20 Claims, 5 Drawing Sheets

LEVEL SHIFTER WITH BOOST CIRCUIT

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In modern circuitry, a voltage level shifter refers to an important circuit in various interface circuits that have input-output (IO) ports at different voltage levels. Sometimes, voltage level shifting may be challenging when an input voltage level is near sub-threshold levels of a transistor device because the transistor device may not turn-on even when the size of the transistor device is increased. Also, in lower nodes when core voltage shrinks to substantially low levels (e.g., near or lower than the voltage threshold (Vth) of transistor devices), application issues arise that are challenging in IOs to meet a desired level shifter performance with lesser area and leakage. Unfortunately, existing architectures typically do not support near-threshold operating voltages with optimized power, performance and area (PPA) criteria. Also, the existing architectures fail to meet performance criteria due to unreliable designs and leakage concerns. As such, there exists a need to improve the design characteristics and behaviors of level shifting circuitry.

BRIEF DESCRIPTION OF THE DRAWINGS

Implementations of various metal layout techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to level shifting circuitry with boost and also to various schemes and techniques for providing a high performance level shifter with ultra-low voltage support. The various implementations described herein refer to level shifting architecture having boost circuitry that supports ultra-low voltage and high frequencies for improved performance. Also, the various implementations described herein provide for an ultra-low/near-threshold voltage level shifter that uses single oxide input-output (IO) devices. For instance, the various schemes and techniques described herein may be adapted to support level shifting within a voltage range of ultra-low core voltage (e.g., 0.45V) to input-output (IO) voltage (e.g., 1.98V) with high performance of up to 300 MHz with less area. Also, the various schemes and techniques described herein may be adapted to support level shifting within a voltage range of sub-threshold core voltage levels (e.g., 0.36V) to input-output (IO) voltage (e.g., 1.98V) with functional of up to 10 MHz with less area. As described herein, the voltage level shifter may have multiple stages, such as, e.g., a first stage, a second stage and a third stage. In this instance, the first stage may have a diode-based latch along with feedback assist branches that enable the level shifter to turn-on at near sub-threshold core voltage (VDD) level along with high performance of up to 300 MHz. The second stage may have a latch followed by one or more buffers. The third stage may be configured as a boost circuit that operates to provide a voltage boost to the input voltage for faster level shifting response of the first stage.

Various implementations of level shifting architecture with boost circuitry will now be described in detail herein with reference to FIGS. 1-3.

Figure 1:
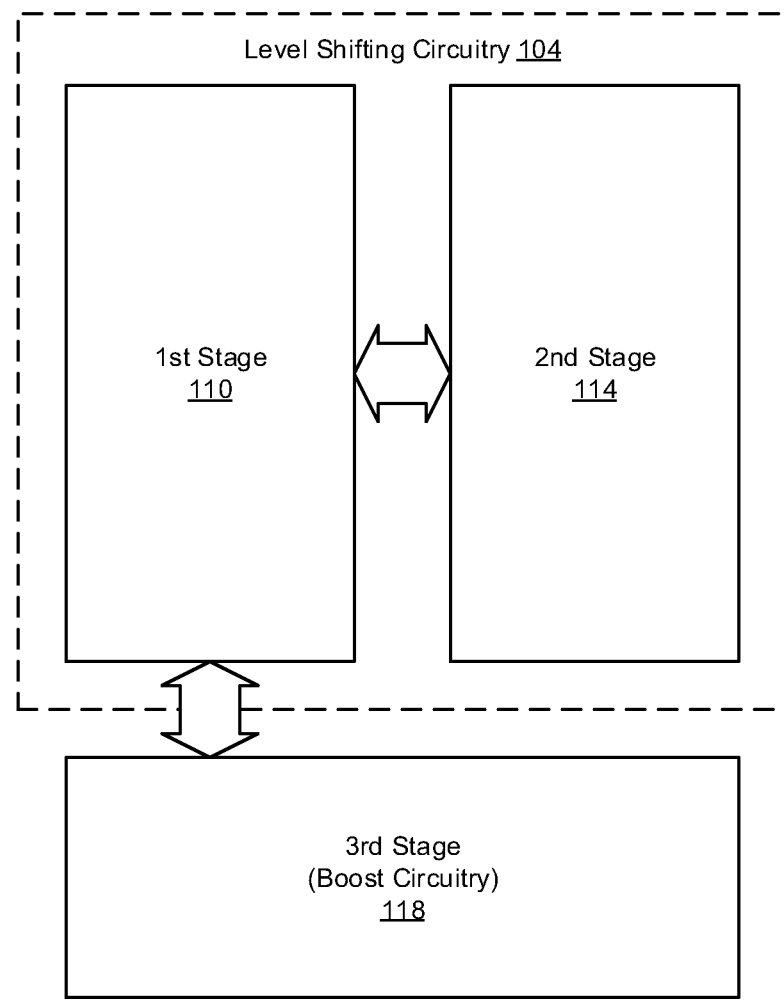
FIG. 1 illustrates a schematic diagram of level shifter architecture with boost in accordance with various implementations described herein.

FIG. 1 illustrates a diagram 100 of level shifter architecture with boost 102 in accordance with various implementations described herein. In some instances, the level shifter architecture with boost 102 may be configured to provide a high performance level shifter with support for ultra-low voltage.

In various implementations, the level shifter architecture with boost 102 may refer to a system or a device having various integrated circuit (IC) components that are arranged and coupled together as an assemblage or combination of parts that provide for a physical circuit design and related structures. In some instances, a method of designing, providing and building the level shifter architecture with boost 102 as an integrated system or device that may be implemented with various IC circuit components is described herein so as to implement level shifting schemes and techniques associated therewith. The level shifter architecture with boost 102 may be integrated with various computing circuitry and related components on a single chip, and the level shifter architecture with boost 102 may be implemented in embedded systems for automotive, electronic, mobile and Internet-of-things (IoT) applications, including remote sensor nodes.

As shown in FIG. 1, the level shifter architecture with boost 102 may include level shifting circuitry 104 that shifts an input voltage in a first domain (e.g., VDD domain) to an output voltage in a second domain (e.g., DVDD domain). In some implementations, the level shifting circuitry 104 may shift the input voltage to the output voltage based on a first level shifting response. The second domain (DVDD domain) is different than the first domain (VDD domain), and the second domain (DVDD domain) may be greater than the first domain (VDD domain). The input voltage in the first domain (VDD domain) may refer to a low core voltage that is capable of rising to a near-sub-threshold voltage (e.g., Vth) of a transistor, and the output voltage in the second domain (DVDD domain) may refer to a high output voltage that is greater than the low core voltage.

In some implementations, the level shifting circuitry 104 may include multiple stages, including, e.g., a first stage 110 and a second stage 114, that are coupled together and arranged to provide a level shifting response to the input voltage. In some instances, the level shifting circuitry 104 (e.g., stages 110, 114) may be configured to shift the input voltage within a first time interval based on the first level shifting response. As described herein below in reference to FIG. 2A, the level shifting circuitry 104 may include the first stage 110 as a first circuit (or some part thereof) having first input transistors, a diode, a first latch and a feedback circuit that are arranged and configured to shift the input voltage to the output voltage. Also, as described herein below in reference to FIG. 2B, the level shifting circuitry 104 may include the second stage 114 as a second circuit having second input transistors, a second latch and output buffers that are arranged and configured to receive the output voltage and provide a buffered output voltage to the first circuit (i.e., first stage 110) as feedback to enable activation of the feedback circuit of the first circuit i.e., first stage 110). The first stage 110 and the second stage 114 are described in greater detail herein in reference to FIGS. 2A-2B, respectively.

The level shifter architecture with boost 102 may include boost circuitry 118 that increases the input voltage and then provides a boosted input voltage to the level shifting circuitry 104 so that the level shifting circuitry 104 may shift the input voltage to the output voltage based on the boosted input voltage. In some instances, the level shifting circuitry 104 may be configured to shift the input voltage to the output voltage based on a second level shifting response that is quicker (or faster) than the first level shifting response.

In some implementations, the level shifting circuitry 104 may include the boost circuitry 118 as a third stage 118 that is configured to provide the boosted input voltage to the level shifting circuitry 104 so that the level shifting circuitry 104 may shift the input voltage within a second time interval based on the second level shifting response that is quicker (or faster) than the first level shifting response. Also, the second time interval is shorter than the first time interval. In some instances, the output voltage and the buffered output voltage are in the second domain (DVDD domain). The boost circuitry 118 (or the third stage) is described in greater detail herein in reference to FIG. 2C.

Figure 2A:
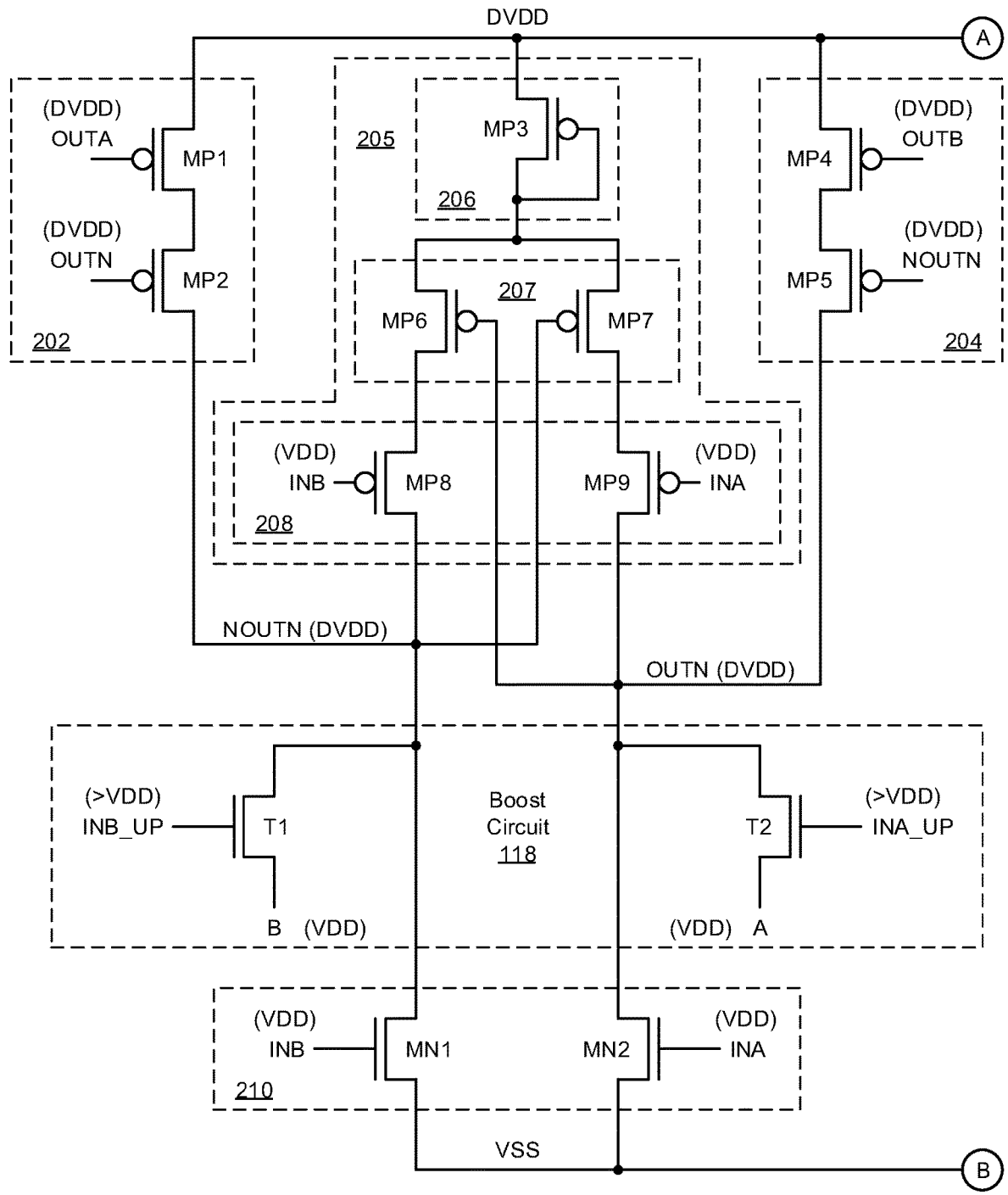
FIGS. 2A-2C illustrates various diagrams of multi-stage level shifter circuitry in accordance with various implementations described herein.
Figure 2B:
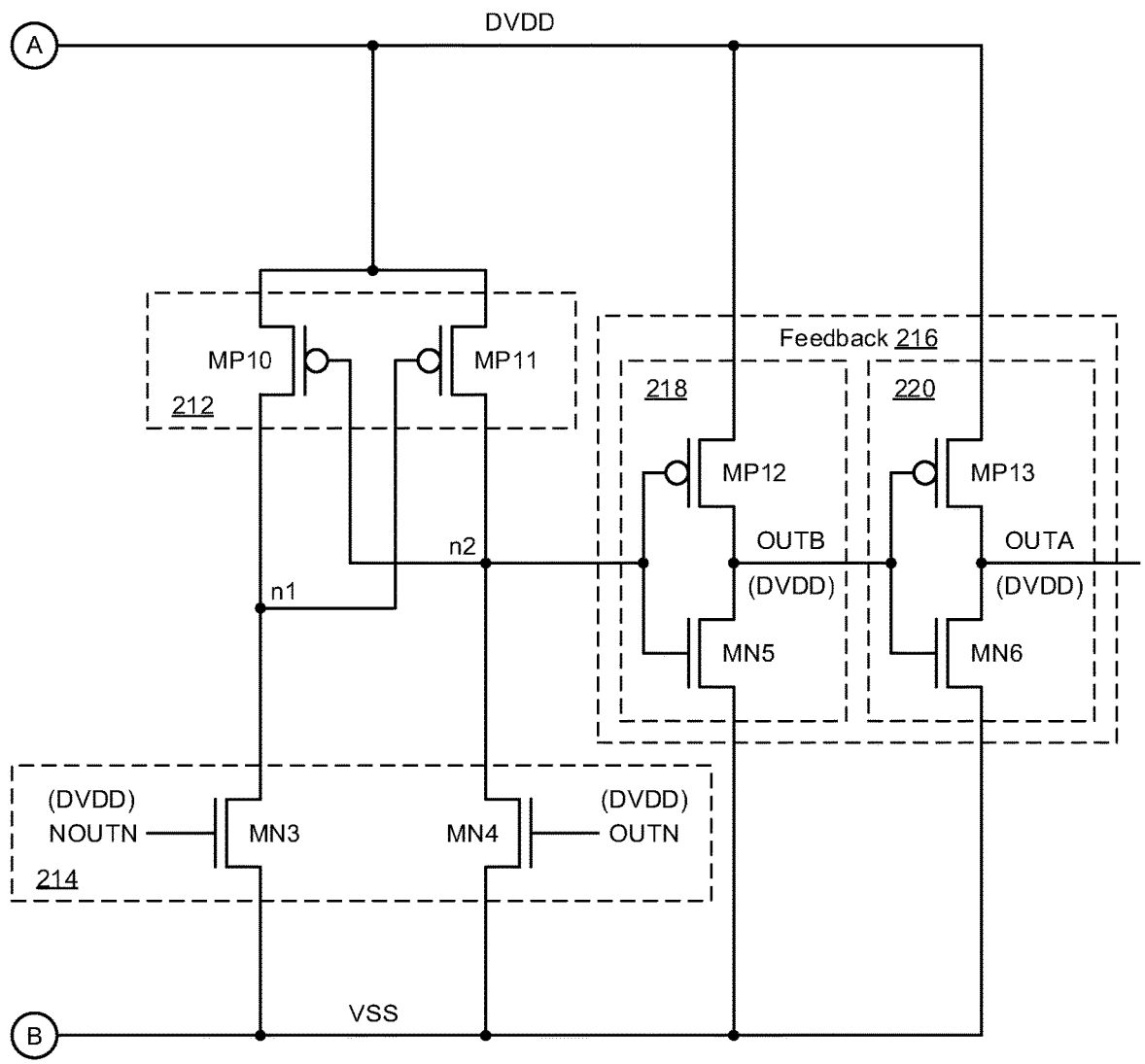
Figure 2C:
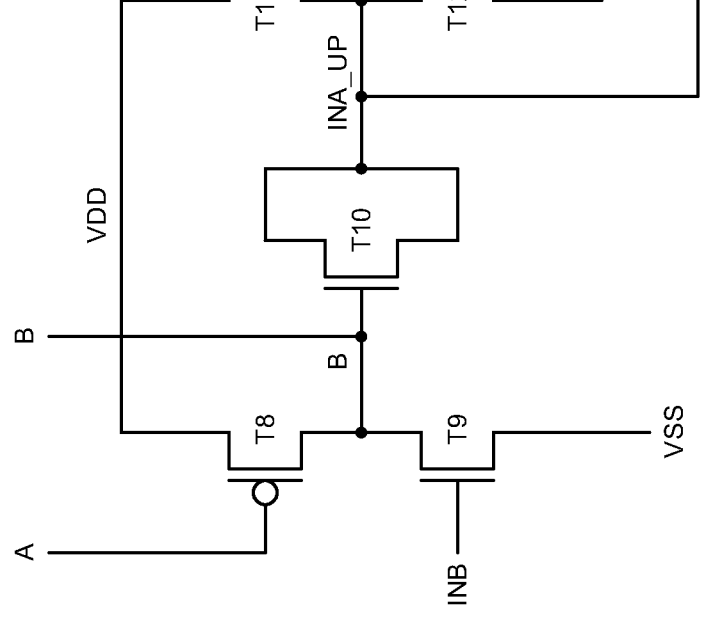
Figure 2C:
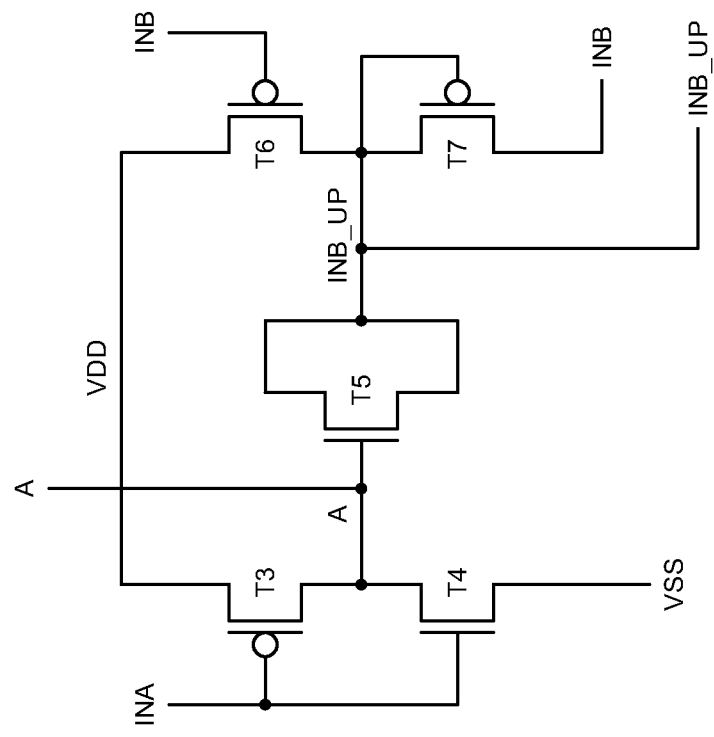

FIGS. 2A-2C illustrate various diagrams of multi-stage level shifter circuitry 200 in accordance with various implementations described herein. The multi-stage level shifter circuitry 200 further describes the multiple stages 110, 114, 118 of the level shifter architecture with boost 102 of FIG. 1 in greater detail. In particular, FIG. 2A shows a diagram 200A of the first stage 110, FIG. 2B shows a diagram 200B of the second stage 114, and FIG. 2C shows a diagram 200C of the third stage 118.

As shown in FIG. 2A, the first stage 110 (or first circuit) may include first input transistors 210, a diode 206, a first latch 207 and a feedback circuit 202, 204 that are arranged and configured to shift the input voltage (INA, INB) to the output voltage (OUTN, NOUTN), wherein INA and INB are complementary signals. In some implementations, the diode 206 (MP3) may be coupled between a first source voltage (DVDD) and the first latch 207 (MP6, MP7), and the first latch 207 (MP6, MP7) may be coupled between the diode 206 (MP3) and the first input transistors 210 (MN1, MN2). Also, the feedback circuit 202 (MP1, MP2), 204 (MP4, MP5) may be coupled between the first source voltage (DVDD) and the first input transistors 210 (MN1, MN2), and the first input transistors 210 (MN1, MN2) may be coupled between the first latch 207 (MP6, MP7) and ground (VSS or Gnd). Also, the first input transistors 210 (MN1, MN2) may be activated by the input voltage (INA, INB), and the feedback circuit 202 (MP1, MP2), 204 (MP4, MP5) may provide the output voltage (OUTN, NOUTN) when activated by the buffered output voltage (OUTA, OUTB).

Also, as shown in FIG. 2A, the first stage 110 (or first circuit) may include a portion of the boost circuit 118, such as, e.g., pass transistors (T1, T2) that are coupled between the first latch 207 (MP6, MP7) and the first input transistors 210 (MN1, MN2). In some implementations, the pass transistors (T1, T2) may be activated based on boosted input signals (INA_UP, INB_UP), which may be greater than VDD (i.e., >VDD). In some instances, a first pass transistor (T1) may be coupled to the output node (NOUTN) so as to pass a node signal (B) to the output node (NOUTN) when activated by the boosted input signal (INB_UP). Also, in some instances, a second pass transistor (T2) may be coupled to the output node (OUTN) so as to pass another node signal (A) to the output node (OUTN) when activated by the boosted input signal (INA_UP). As described herein below in reference to FIG. 2C, the nodes (A, B) are coupled to the same nodes (A, B) of the boost circuit 218 (or the third stage).

In some implementations, as shown in FIG. 2A, the first stage 110 of the level shifter may include multiple metal-oxide-semiconductor (MOS) transistors, such as, e.g., p-type MOS (PMOS) transistors and n-type MOS (NMOS) transistors. In some instances, transistors (T1, T2, MN1, MN2) may be Thick-Oxide NMOS transistors, and transistors (MP1, MP2, MP3, MP4, MP5, MP6, MP7, MP8, MP9) may also be Thick-Oxide PMOS transistors. However, various other configurations may be used.

As shown in FIG. 2A, the first stage 110 includes first transistors arranged as the diode 206, the first latch 207, and the feedback assist 202, 204 to facilitate shifting an input voltage (INA, INB) in a first voltage domain (VDD) to an output voltage (OUTN, NOUTN) in a second voltage domain (DVDD) that is greater than the first voltage domain (VDD). The first stage 110 may use the diode 206 and the first latch 207 so as to reduce contention between the first latch 207 and the first input transistors 210 and the first pass transistors (T1,T2). In addition, the diode 206, the first latch 207, and the feedback assist 202, 204 may enable activation of the first pass transistors (T1,T2) with the boosted input voltage (INA_UP, INB_UP) and enable activation of the first input transistors 210 with the input voltage (INA, INB).

The first stage 110 has a diode-drop latch 205 that refers to the combination of the diode 206 and the first latch 207. The diode 206 refers to a diode-coupled transistor (e.g., MP3) that is coupled together to operate as the diode 206, and the first latch 207 may include multiple transistors (e.g., MP6, MP7) that are arranged to operate as the first latch 207. The feedback assist 202, 204 of the first stage 110 may include first feedback assist transistor circuitry (e.g., MP1, MP2) and second feedback assist transistor circuitry (e.g., MP4, MP5) that are arranged to receive the output voltage (OUTN, NOUTN) and the buffered output voltage (OUTA, OUTB) and also provide the output voltage (OUTN, NOUTN) to the first input transistors 210 and the first pass transistors (T1, T2). In some instances, the output of the level shifter (LS) 102 may be taken from the OUTA/OUTB nodes or the OUTN/NOUTN nodes.

The first input transistors 210 of the first stage 110 may include a first input transistor (e.g., MN1) and a second input transistor (e.g., MN2). The first input transistor (MN1) may be activated by a first input voltage (INB) of the input voltages (INA, INB), and the second input transistor (MN2) may be activated by a second input voltage (INB) of the input voltages (INA, INB).

The first latch 207 may include a latch circuit having latch input transistors 208 that are coupled between the first latch 207 and the first input transistors 210. The first latch 207 and the latch input transistors 208 may be integrated together in a combined latch circuit. The latch input transistors 208 may include a first latch input transistor (e.g., MP8) and a second latch input transistor (e.g., MP9). The first latch input transistor (MP8) may be activated by the first input voltage (INB) of the input voltages (INA, INB), and the second latch input transistor (MP9) may be activated by the second input voltage (INA) of the input voltages (INA, INB).

As shown in FIG. 2B, the second stage 114 (or second circuit) may include second input transistors 214, a second latch 212 and output buffers 218, 220 that are arranged and configured to receive the output voltage (OUTN, NOUTN) and provide the buffered output voltage (OUTA, OUTB) to the first stage 110 (or first circuit) as feedback to enable activation of the feedback circuitry 216 of the first stage 110 (or first circuit).

The output voltage (OUTN, NOUTN) and the buffered output voltage (OUTA, OUTB) may be in the second domain (DVDD domain). In some implementations, the second latch 212 (MP10, MP11) may be coupled between the first source voltage (DVDD) and the second input transistors 214 (MN3, MN4), and the second input transistors 214 (MN3, MN4) may be coupled between the second latch 212 (e.g., MP10 at node n1, MP11 at node n2) and ground (VSS or Gnd). Also, an output of transistor (MP10) may be coupled to a gate of transistor (MP11) at node (n1), and an output of transistor (MP11) may be coupled to a gate of transistor (MP10) at node (n2). The second input transistors 214 (MN3, MN4) may be activated by the output voltage (OUTN, NOUTN) from the feedback circuit 202 (MP1, MP2), 204 (MP4, MP5) of the first stage 110 (or first circuit). Also, the output buffers 218, 220 may be coupled between the first source voltage (DVDD) in the second domain (DVDD) and ground (VSS or Gnd). Also, in some instances, an input (n2) of the output buffers 218, 220 may be coupled to node (n2), which is disposed between the second latch 212 (MP10, MP11) and the second input transistors 214 (MN3, MN4).

In some implementations, as shown in FIG. 2B, the second stage 114 of the level shifter may include multiple MOS transistors, such as, e.g., PMOS transistors and NMOS transistors. In some instances, transistors (MN3, MN4, MN5, MN6) may be Thick-Oxide NMOS transistors, and also, transistors (MP10, MP11, MP12, MP13) may be Thick-Oxide PMOS transistors. However, various other configurations may be used.

As shown in FIG. 2B, the second stage 114 has second transistors arranged as a second latch 212 followed by the output buffers 218, 220 that provide the buffered output voltage (OUTA, OUTB) as feedback (e.g., 216) to the feedback assist 202, 204 of the first stage 110. Also, the second stage 114 may include second input transistors 214 including a third input transistor (e.g., MN3) and a fourth input transistor (e.g., MN4). The third input transistor (MN3) may be activated by a first output voltage (NOUTN) of the output voltages (OUTN, NOUTN), and the fourth input transistor (MN4) may be activated by a second output voltage (OUTN) of the output voltages (OUTN, NOUTN).

In some instances, a first output buffer 218 of the output buffers 218, 220 of the second stage 114 may provide a first output voltage (OUTB) of the output voltage (OUTA, OUTB) as a first feedback voltage of the feedback (e.g., 216) to the feedback assist 202, 204 of the first stage 110. Also, a second output buffer 220 of the output buffers 218, 220 of the second stage 114 may provide a second output voltage OUTA of the output voltage (OUTA, OUTB) as a second feedback voltage of the feedback (e.g., 216) to the feedback assist 202, 204 of the first stage 110.

The second transistors of the second stage 114 may be arranged to support various operating frequencies above a predetermined operating frequency, such as, e.g., operating frequencies above 200 MHz. The second stage 114 may use the second latch 212 to enable the operating frequencies above the predetermined operating frequency, and the second stage 114 may use the output buffers 218, 220 to provide the feedback (e.g., 216) in the second voltage domain DVDD to the first stage 110. In some cases, the higher frequencies may refer to an upper boundary of 300 MHz, and in other cases, the higher frequencies may refer to a range of pulse frequencies that are between 200 MHz and 300 MHz in reference to VDD and DVDD. Also, the higher frequencies may be with respect to the input voltages (INA/INB) at core voltage level VDD and the output voltages (OUTN/NOUTN and OUTA/OUTB) at the higher output voltage level DVDD.

In some instances, the input voltage (INA, INB) in the first voltage domain (VDD) may refer to a low core voltage (VDD), and the output voltage (OUTN, NOUTN) in the second voltage domain (DVDD) may refer to a high output voltage (DVDD) that is greater than the low core voltage (VDD). In some instances, the first voltage domain (VDD) may refer to a voltage range between 0.45V to 1.0V, and the second voltage domain (DVDD) may refer to a voltage range between 1.08V to 1.98V. In this instance, the level shifter 102 may be implemented as an upshifting level shifter that upshifts the low core voltage VDD to the higher output voltage DVDD, which may be referred to as an input-output (IO) operating voltage in the high output voltage domain (i.e., DVDD domain).

In some instances, the level shifter 102 may be reconfigured and implemented as a downshifting level shifter that may be used to downshift a higher input voltage DVDD (which may be referred to as an IO input voltage) to the lower core voltage VDD. As such, the downshifting level shifter may be configured to support a higher DVDD input voltage range of 1.08V to 1.98V and a lower VDD output voltage range of 0.675V to 1.0V.

As shown in FIG. 2C, the third stage 118 (or boost circuit) includes the pass transistors (T1, T2, as shown in FIG. 2A) that are coupled between the first latch 207 (MP6, MP7) and the first input transistors 210 (MN1, MN2), and the pass transistors (T1, T2) may be activated based on the boosted input signals (INA_UP, INB_UP). In some instances, the third stage 118 (or boost circuit) may include a first boost circuit 118A that boosts the input signal (INB) and provides the boosted input signal (INB_UP), and also, the third stage 118 (or boost circuit) may include a second boost circuit 118B that boosts the input signal (INA) and provides the boosted input signal (INA_UP).

In some implementations, the boost circuit 118A may include an inverter circuit (T3, T4) that is coupled between a second source voltage (VDD) in the first domain (VDD domain) and ground (VSS). Also, the boost circuit 118A may include a control circuit (T6, T7) that is coupled between the second source voltage (VDD) and the input node (INB) that provides the input voltage (INB). Also, the boost circuit 118A may include a capacitor circuit (T5) that is coupled between the inverter circuit (T3, T4) and the control circuit (T6, T7). Also, the capacitor circuit (T5) may be charged by the inverter and control circuit (T3, T4, T6, T7) and provide the boosted input voltage (INB_UP) to the pass transistor (T1). Also, the transistor (T5) is coupled together so as to operate as a capacitor, and the transistor (T6) is coupled together so as to operate as a switch, and also the transistor (T7) is coupled together so as to operate as a diode.

In some implementations, the boost circuit 118B may include an inverter circuit (T8, T9) that is coupled between the second source voltage (VDD) in the first domain (VDD domain) and ground (VSS). Also, the boost circuit 118B may include a control circuit (T11, T12) that is coupled between the second source voltage (VDD) and the input node (INA) that provides the input voltage (INA). Also, the boost circuit 118B may include a capacitor circuit (T10) that is coupled between the inverter circuit (T8, T9) and the control circuit (T11, T12). The capacitor circuit (T10) may be charged by the inverter and control circuit (T8, T9, T11,T12) and provide the boosted input voltage (INA_UP) to the pass transistor (T2). Also, in some instances, the transistor (T10) is coupled together so as to operate as a capacitor, and the transistor (T11) is coupled together so as to operate as a switch, and also, the transistor (T12) is coupled together so as to operate as a diode.

Moreover, in some implementations, the pass transistor (T1) of FIG. 2A may provide the node signal (B) to the boost circuit 118A, and also, the pass transistor (T2) of FIG. 2A may provide the node signal (A) to the boost circuits 118A, 118B. As shown in FIG. 2C, the node signal (A) may be provided to a gate of transistor (T5), and the node signal (B) may be provided to a gate of transistor (T10). The input signal (INA) may be provided to gates of transistors (T3, T4) of boost circuit 118A and to a gate of transistor (T11) of boost circuit 118B, and also, the input signal (INA) may be coupled to a drain of transistor (T12). Also, the input signal (INB) may be provided to a gate of transistor (T6) of boost circuit 118A and to a gate of transistor (T9) of boost circuit 118B, and the input signal (INB) may be coupled to a drain of transistor (T7).

In some implementations, as shown in FIG. 2C, the boost circuit 118A boosts the input signal (INB) and provides the boosted input signal (INB_UP). The boost circuit 118A may include multiple metal-oxide-semiconductor (MOS) transistors, such as, e.g., p-type MOS (PMOS) transistors and n-type MOS (NMOS) transistors. In some instances, transistors (T1, T4, T5) may be Thin-Oxide NMOS transistors, and also, transistors (T3, T6, T7) may be Thin-Oxide PMOS transistors. However, various other configurations may be used.

In some implementations, as shown in FIG. 2C, the boost circuit 118B boosts the input signal (INA) and provides the boosted input signal (INA_UP). The boost circuit 118B may include multiple MOS transistors, such as, e.g., PMOS transistors and NMOS transistors. In some instances, transistors (T2, T9, T10) may be Thin-Oxide NMOS transistors, and also, transistors (T8, T11, T12) may be Thin-Oxide PMOS transistors. However, as with boost circuit 118A, various other configurations may be used for boost circuit 118A.

In some implementations, in reference to FIGS. 2A-2C, the level shifter (LS) may refer to a multi-stage level shifter with boost. In this instance, the multi-stage level shifter may include the first stage 110 (in FIG. 2A), the second stage 114 (in FIG. 2B), and the third stage 118 as a boost circuit (in FIG. 2C).

The first stage 110 may be configured to level-shift an input voltage (INA, INB) in a first domain (VDD domain) to an output voltage (OUTN, NOUTN) in a second domain (DVDD domain) based on the buffered feedback voltage (OUTA, OUTB) in the second domain (DVDD domain). In some instances, the second domain (DVDD domain) may be different than the first domain (VDD domain), and the second domain (DVDD domain) may be greater than the first domain (VDD domain). In some instances, the first stage 110 may level-shift the input voltage (INA, INB) within a first time interval based on a first level shifting response to the input signal (INA, INB).

The second stage 114 may be configured to provide the feedback voltage (OUTA, OUTB) to the first stage 110 when enabled by the output voltage (OUTN, NOUTN) from the first stage 110. Also, the third stage 118 may be configured to increase the input voltage (INA, INB) and provide the boosted input voltage (INA_UP, INB_UP) to the first stage 110 so that the first stage 110 level-shifts the input voltage (INA, INB) to the output voltage (OUTN, NOUTN) based on the boosted input voltage (INA_UP, INB_UP).

In some instances, the third stage 118 may provide the boosted input voltage (INA_UP, INB_UP) to the first stage 110 so that the first stage 110 level-shifts the input voltage (INA, INB) within a second time interval based on a second level shifting response to the boosted input voltage (INA_UP, INB_UP). In some instances, the second level shifting response is quicker (or faster) than the first level shifting response, and also, the second time interval is shorter than the first time interval.

In some instances, the third stage 118 may include pass transistors (T1, T2, as shown in FIG. 2A) that are coupled to the first stage 110, and the pass transistors (T1, T2) may be activated based on the boosted input voltage (INA_UP, INB_UP). The third stage 118 may include an inverter circuit (T3, T4 and T8, T9, as shown in FIG. 2C) that is coupled between a source voltage (VDD) and ground (VSS). The third stage 118 may include a diode circuit (T6, T7 and T11, T12, as shown in FIG. 2C) that is coupled between the source voltage (VDD) and an input node (INA, INB) that provides the input voltage (INA, INB). The third stage 118 may include a capacitor circuit (T5, T10) that is coupled between the inverter circuit (T3, T4 and T8, T9) and the control circuit (T6, T7 and T11, T12). In some implementations, the capacitor circuit (T5, T10) may be charged by the inverter circuit (T3, T4 and T8, T9), and the capacitor circuit (T5, T10) may provide the boosted input voltage (INA_UP, INB_UP) to the pass transistors (T1, T2).

In some implementations, in reference to FIGS. 2A-2C, the third stage boost circuit 118 may operate to provide faster turn-on of higher threshold voltage (Vt) devices (T1, T2, as shown in FIG. 2A) when compared to substantially low core voltage (VDD) inputs (INA, INB) so as to meet high frequency performance criteria, which is achievable with the boost circuit 218. For instance, in reference to a logic_1 state, the input gate voltages (INA_UP, INB_UP) applied to transistors (T1, T2) may be configured to rise faster to higher levels (e.g., VDD+Vboost), and the node voltages (A, B) will be at logic_0 level. Also, in reference to a logic_0 state, the input gate voltages (INA_UP, INB_UP) applied to transistors (T1, T2) may be kept at the core voltage level (VDD), and the node voltages (A, B) may also be at the core voltage level (VDD).

In reference to operation of the third stage boost circuit 118 in FIG. 2C, the INA boost circuit 118B may have an initial state of INA=0, INB=1, which means that A=1, B=0, so that the capacitor (T10) is charged to VDD level at the INA_UP node. When INA becomes 1, and INB=0 and A=0, then transistors (T9, T11) turn-off, and transistor (T8) turns-on, so that node (B) will charge to VDD which will coupled to the INA_UP node and raise the voltage to VDD+Vboost (e.g., because voltage across the capacitor T10 cannot change abruptly). Thus, the INA_UP node becomes VDD+Vboost, and A=0, which will make transistor (T2) turn-on. Also, the INB_UP node along with node (B) becomes VDD, which will make transistor (T1) turn-off. Moreover, the INB boost circuit 118A may operate in a similar manner. In some instances, the diode devices (T7, T12) may be used to not bring down the INA_UP/INB_UP nodes to lower voltages that may be below Vt for longer DC state conditions, rather than keeping the INA_UP/INB_UP nodes floating.

Figure 3:
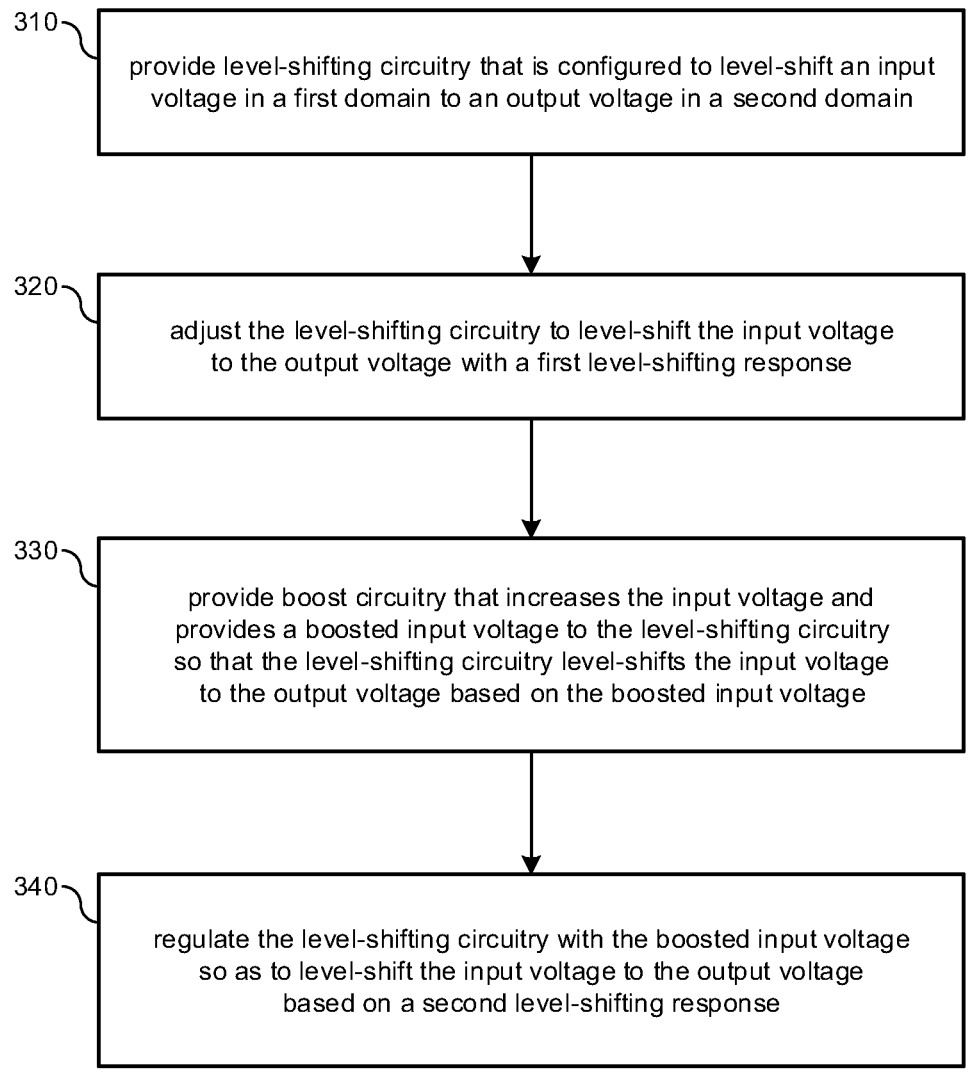
FIG. 3 illustrates a process diagram of a method for providing a level shifter with boost in accordance with implementations described herein.

FIG. 3 illustrates a process flow diagram of a method 300 for providing a level shifter with boost in accordance with implementations described herein.

It should be understood that even though method 300 indicates a particular order of operation execution, in some cases, various certain portions of the operations may be executed in a different order, and on different systems. In other cases, additional operations and/or steps may be added to and/or omitted from method 300. Also, method 300 may be implemented in hardware and/or software. If implemented in hardware, the method 300 may be implemented with various components and/or circuitry, as described herein in reference to FIGS. 1-2C. Also, if implemented in software, method 300 may be implemented as a program or software instruction process configured for providing a level shifting circuit with boost, as described herein. Further, if implemented in software, instructions related to implementing the method 300 may be stored in memory and/or a database. For instance, a computer or various other types of computing devices having a processor and memory may be configured to perform method 300.

As described and shown in reference to FIG. 3, method 300 may be used for fabricating and/or manufacturing, or causing to be fabricated and/or manufactured, an integrated circuit (IC) that implements level shifting schemes and techniques as described herein that are related to providing a level shifter with boost and/or various associated devices, components and/or circuits.

At block 310, method 300 may provide level shifting circuitry that is configured to level-shift an input voltage in a first domain (e.g., VDD domain) to an output voltage in a second domain (e.g., DVDD domain). In some instances, the second domain (DVDD domain) is different than the first domain (VDD domain), and the second domain (DVDD domain) may be greater than the first domain (VDD domain). In some instances, the input voltage in the first domain (VDD domain) may refer to a low core voltage, and the output voltage in the second domain (DVDD domain) may refer to a higher output voltage that is greater than the low core voltage.

At block 320, method 300 may adjust the level shifting circuitry to level-shift the input voltage to the output voltage with a first level shifting response. In some instances, the level shifting circuitry may level-shift the input voltage within a first time interval based on a first level shifting response.

At block 330, method 300 may provide boost circuitry that increases the input voltage and provides a boosted input voltage to the level shifting circuitry so that the level shifting circuitry level-shifts the input voltage to the output voltage based on the boosted input voltage. In some instances, the boost circuitry provides the boosted input voltage to the level shifting circuitry so that the level shifting circuitry level-shifts the input voltage within a second time interval based on a second level shifting response.

Also, at block 340, method 300 may regulate the level shifting circuitry with the boosted input voltage so as to level-shift the input voltage to the output voltage based on the second level shifting response. In some instances, the second level shifting response may be faster (or quicker) than the first level shifting response, and also, the second time interval maybe shorter than the first time interval.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include a level shifting circuit that shifts an input voltage in a first domain to an output voltage in a second domain, and the level shifting circuit may shift the input voltage to the output voltage based on a first level shifting response. The device may include a boost circuit that increases the input voltage and provides a boosted input voltage to the level shifting circuit so that the level shifting circuit shifts the input voltage to the output voltage based on the boosted input voltage.

Described herein are various implementations of a level shifter. The level shifter may include a first stage that level-shifts an input voltage in a first domain to an output voltage in a second domain based on a feedback voltage in the second domain. The level shifter may include a second stage that provides the feedback voltage to the first stage when enabled by the output voltage from the first stage. The level shifter may include a third stage that increases the input voltage and provides a boosted input voltage to the first stage so that the first stage level-shifts the input voltage to the output voltage based on the boosted input voltage.

Described herein are various implementations of a method. The method may include providing level shifting circuitry that is configured to level-shift an input voltage in a first domain to an output voltage in a second domain. The method may include adjusting the level shifting circuitry to level-shift the input voltage to the output voltage with a first level shifting response. The method may include regulating the level shifting circuitry with a boosted input voltage so as to level-shift the input voltage to the output voltage based on a second level shifting response.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device comprising:
a level shifting circuit that shifts an input voltage in a first domain to an output voltage in a second domain, wherein the level shifting circuit shifts the input voltage to the output voltage based on a first level shifting response; and
a boost circuit that increases the input voltage and provides a boosted input voltage to the level shifting circuit so that the level shifting circuit shifts the input voltage to the output voltage based on the boosted input voltage, wherein the level shifting circuit comprises:
a first circuit comprising a feedback circuit configured to shift the input voltage to the output voltage, and
a second circuit configured to receive the output voltage and provide a buffered output voltage to the first circuit as feedback to enable activation of the feedback circuit of the first circuit.

2. The device of claim 1, wherein the second domain is different than the first domain, and wherein the second domain is greater than the first domain.

3. The device of claim 1, wherein the input voltage in the first domain refers to a low core voltage that is capable of rising to a near-sub-threshold voltage of a transistor, and wherein the output voltage in the second domain refers to a high output voltage that is greater than the low core voltage.

4. The device of claim 1, wherein:
the level shifting circuit shifts the input voltage within a first time interval based on the first level shifting response,
the boost circuit provides the boosted input voltage to the level shifting circuit so that the level shifting circuit shifts the input voltage to the output voltage within a second time interval based on a second level shifting response that is quicker than the first level shifting response, and
the second time interval is shorter than the first time interval.

5. The device of claim 1,
wherein the first circuit further comprises first input transistors, a diode, and a first latch; and
wherein the second circuit comprises second input transistors, a second latch and output buffers.

6. The device of claim 5, wherein the output voltage and the buffered output voltage are in the second domain.

7. The device of claim 5, wherein:
the diode is coupled between a first source voltage and the first latch,
the first latch is coupled between the diode and the first input transistors,
the feedback circuit is coupled between the first source voltage and the first input transistors,
the first input transistors are coupled between the first latch and ground,
the first input transistors are activated by the input voltage, and
the feedback circuit provides the output voltage when activated by the buffered output voltage.

8. The device of claim 5, wherein:
the second latch is coupled between the first source voltage and the second input transistors,
the second input transistors are coupled between the second latch and ground,
the second input transistors are activated by the output voltage from the feedback circuit of the first circuit,
the output buffers are coupled between the first source voltage in the second domain and ground, and
an input of the output buffers is coupled to a node disposed between the second latch and the second input transistors.

9. The device of claim 5, wherein the boost circuit comprises:
pass transistors coupled between the first latch and the first input transistors, wherein
the pass transistors are activated based on the boosted input signal.

10. The device of claim 9, wherein the boost circuit comprises:
an inverter circuit coupled between a second source voltage in the first domain and ground;
a control circuit coupled between the second source voltage and an input node that provides the input voltage; and
a capacitor circuit coupled between the inverter circuit and the control circuit, wherein the capacitor circuit is charged by the inverter circuit and control circuit and provides the boosted input voltage to the pass transistors.

11. A level shifter comprising:
a first stage that level-shifts an input voltage in a first domain to an output voltage in a second domain based on a feedback voltage in the second domain;
a second stage that provides the feedback voltage to the first stage when enabled by the output voltage from the first stage; and
a third stage that increases the input voltage and provides a boosted input voltage to the first stage so that the first stage level-shifts the input voltage to the output voltage based on the boosted input voltage.

12. The level shifter of claim 11, wherein the second domain is different than the first domain, and wherein the second domain is greater than the first domain.

13. The level shifter of claim 11, wherein:
the first stage level-shifts the input voltage within a first time interval based on a first level shifting response to the input signal, and
the third stage provides the boosted input voltage to the first stage so that the first stage level-shifts the input voltage within a second time interval based on a second level shifting response to the boosted input voltage.

14. The level shifter of claim 13, wherein:
the second level shifting response is quicker than the first level shifting response, and
the second time interval is shorter than the first time interval.

15. The level shifter of claim 11, wherein the third stage comprises:
pass transistors coupled to the first stage, wherein the pass transistors are activated based on the boosted input voltage;
an inverter circuit coupled between a source voltage and ground;
a control circuit coupled between the source voltage and an input node that provides the input voltage; and
a capacitor circuit coupled between the inverter circuit and the control circuit, wherein the capacitor circuit is charged by the inverter circuit and control circuit and provides the boosted input voltage to the pass transistors.

16. A method comprising:
providing level shifting circuitry that is configured to level-shift an input voltage in a first domain to an output voltage in a second domain, wherein the level-shifting circuitry comprises first and second circuits, wherein the first circuit comprises a feedback circuit configured to shift the input voltage to the output voltage, and wherein the second circuit is configured to receive the output voltage and provide a buffered output voltage to the first circuit as feedback to enable activation of the feedback circuit of the first circuit;
adjusting the level shifting circuitry to level-shift the input voltage to the output voltage with a first level shifting response; and
regulating the level shifting circuitry with a boosted input voltage so as to level-shift the input voltage to the output voltage based on a second level shifting response.

17. The method of claim 16, wherein the second domain is different than the first domain, and wherein the second domain is greater than the first domain.

18. The method of claim 16, wherein the input voltage in the first domain refers to a low core voltage, and wherein the output voltage in the second domain refers to a high output voltage that is greater than the low core voltage.

19. The method of claim 16, wherein:
the level shifting circuitry level-shifts the input voltage within a first time interval based on the first level shifting response, and
the boosted input voltage is provided to the level shifting circuitry so that the level shifting circuitry level-shifts the input voltage within a second time interval based on the second level shifting response,
wherein the second level shifting response is faster than the first level shifting response, and wherein the second time interval is shorter than the first time interval.

20. The method of claim 16, further comprising:
providing boost circuitry that increases the input voltage and provides the boosted input voltage to the level shifting circuitry so that the level shifting circuitry level-shifts the input voltage to the output voltage based on the boosted input voltage.

* * * * *